(12) United States Patent
Watkins

(10) Patent No.: US 6,588,006 B1
(45) Date of Patent: Jul. 1, 2003

(54) PROGRAMMABLE ASIC

(75) Inventor: Daniel Watkins, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/464,623

(22) Filed: Dec. 16, 1999

(51) Int. Cl.⁷ .............................................. G06F 17/50
(52) U.S. Cl. .............................................. 716/13; 716/1
(58) Field of Search ..................................... 716/1–18

(56) References Cited

U.S. PATENT DOCUMENTS

| | | | | |
|---|---|---|---|---|
| 5,258,919 A | * | 11/1993 | Yamanouchi et al. | 716/11 |
| 5,386,132 A | * | 1/1995 | Wong | 257/316 |
| 5,388,266 A | * | 2/1995 | Frey et al. | 711/163 |
| 5,568,641 A | * | 10/1996 | Nelson et al. | 713/2 |
| 5,585,745 A | * | 12/1996 | Simmons et al. | 326/93 |
| 5,600,790 A | * | 2/1997 | Barnstijn et al. | 714/38 |
| 5,706,473 A | * | 1/1998 | Yu et al. | 716/4 |
| 5,781,769 A | * | 7/1998 | Weber | 713/502 |

* cited by examiner

*Primary Examiner*—Vuthe Siek
*Assistant Examiner*—Sun James Lin
(74) *Attorney, Agent, or Firm*—Christopher P. Maiorana, PC

(57) ABSTRACT

A method for programming a circuit comprising the steps of (A) simulating one or more states, (B) building program information in response to said simulation and (C) extracting from said simulation one or more unique states having current state to next state sequences. The present invention includes a method and/or architecture that may implement (i) content addressable memory system (CAMS), (ii) memory, (iii) register files and (iv) other logic to implement programmability on application specific integrated circuits (ASICs). The architecture is performance and cost competitive with field programmable gate arrays (FPGAs) and programmable logic devices (PLDs).

33 Claims, 15 Drawing Sheets

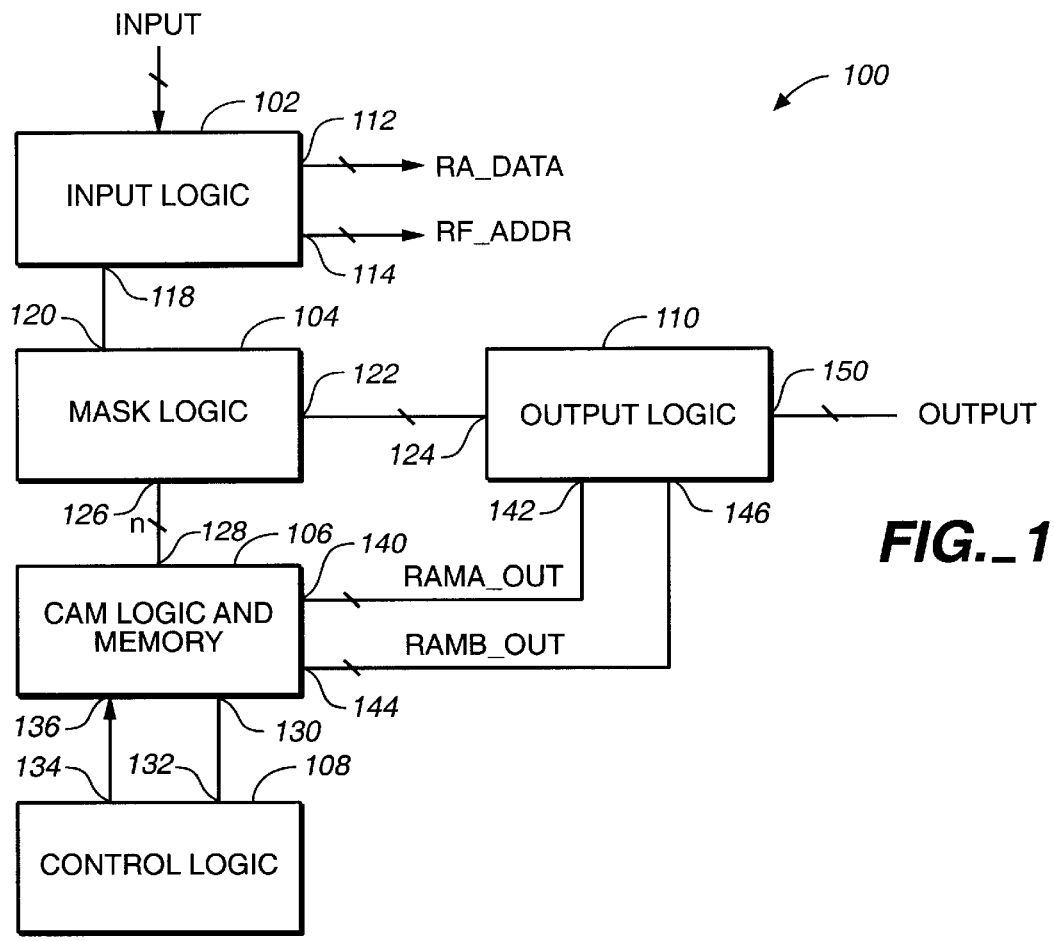
FIG._1
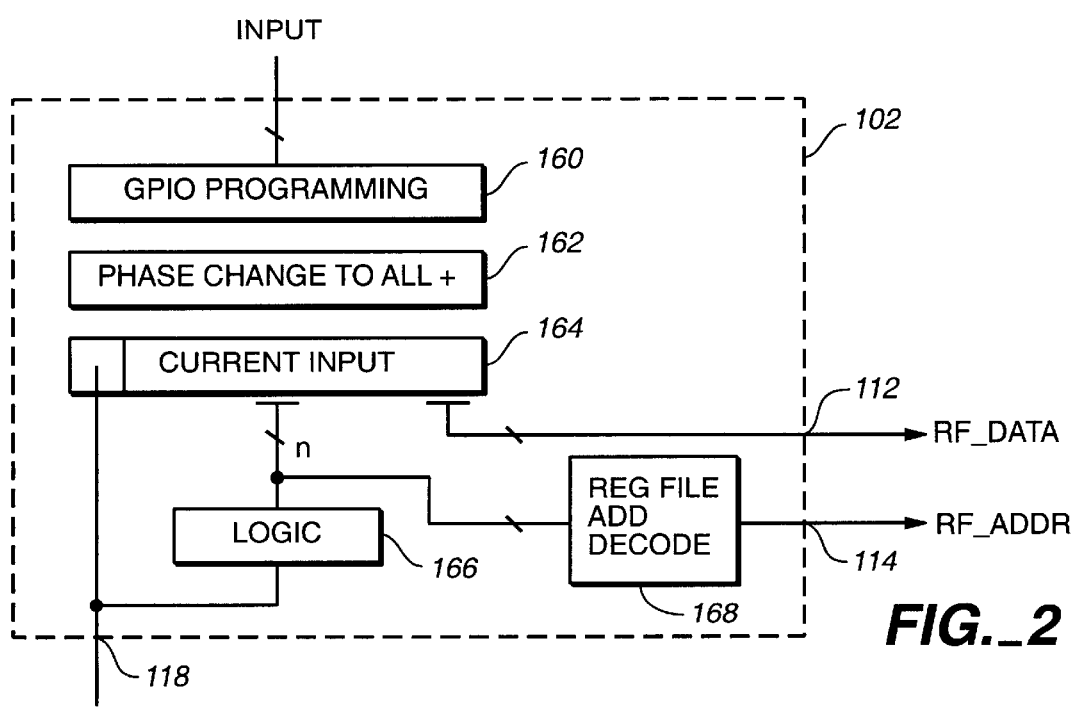
FIG._2

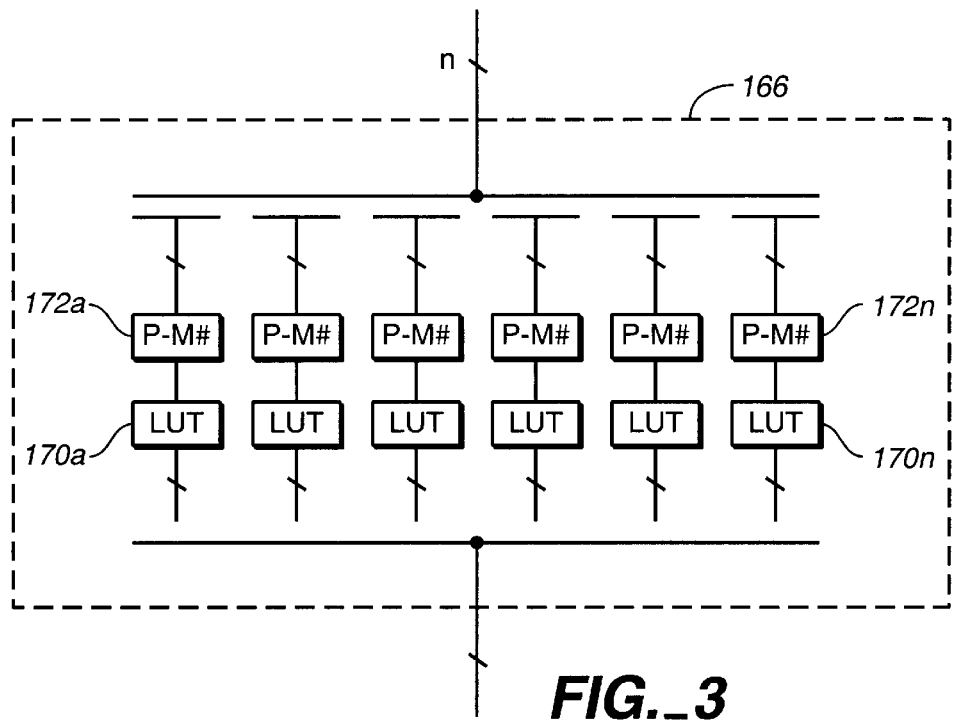
FIG._3
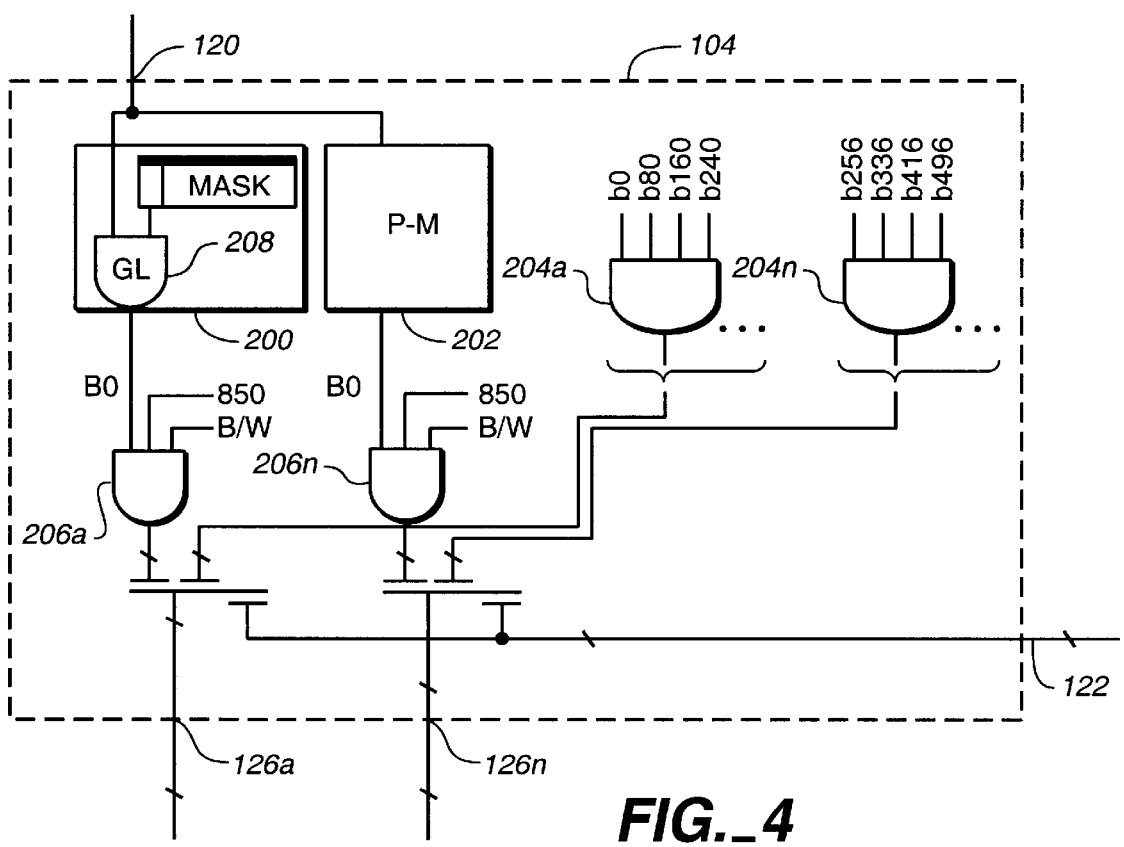
FIG._4

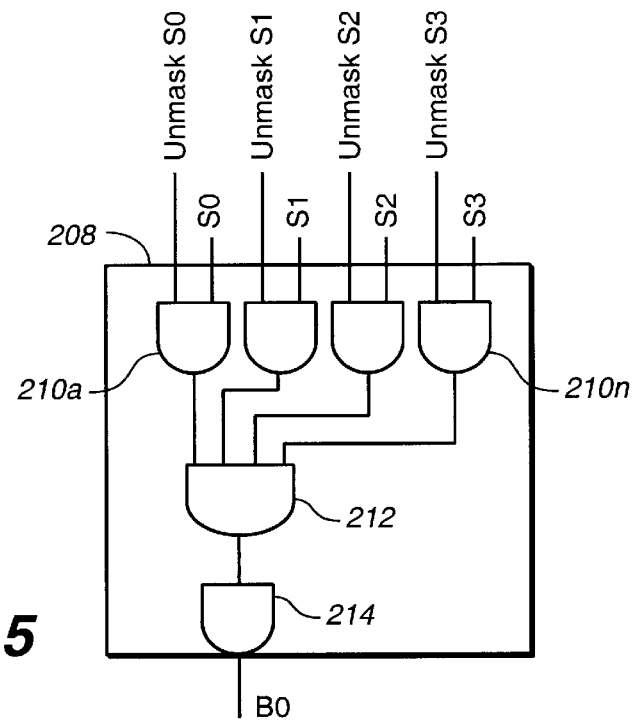
FIG._5
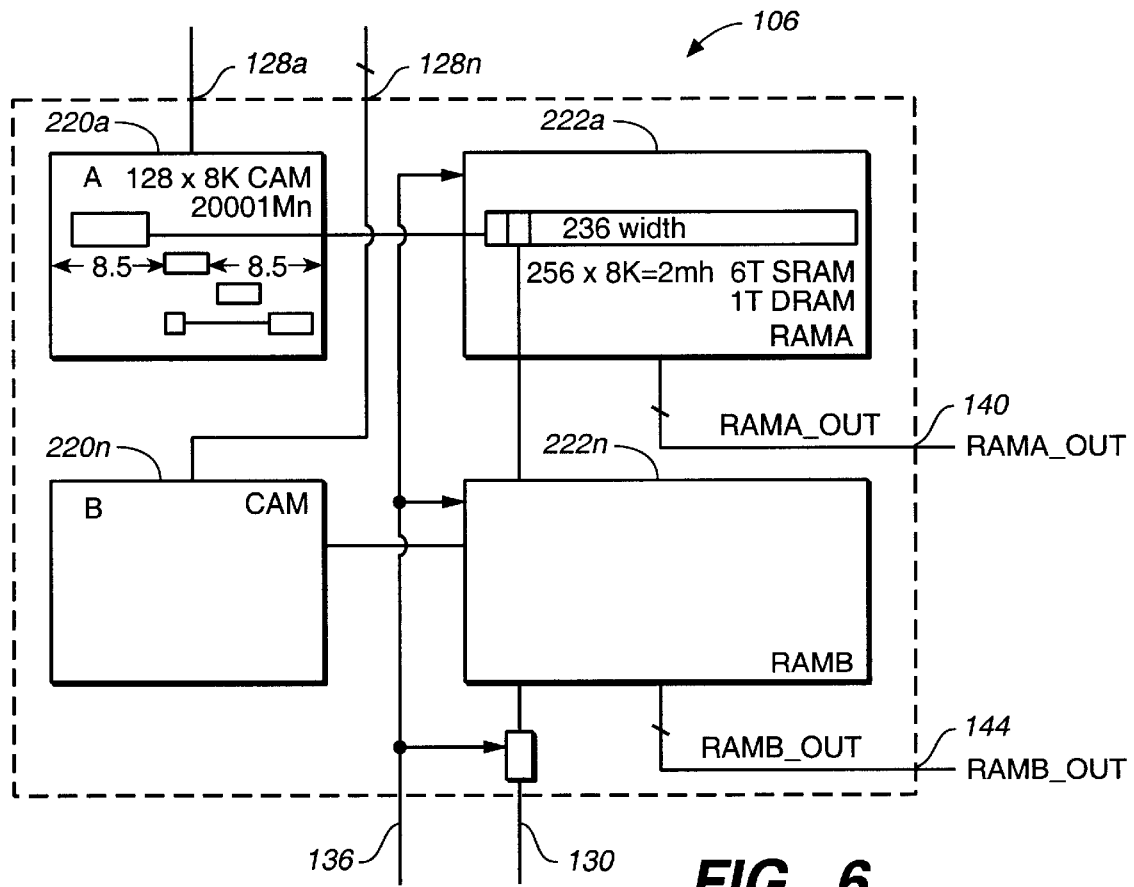
FIG._6

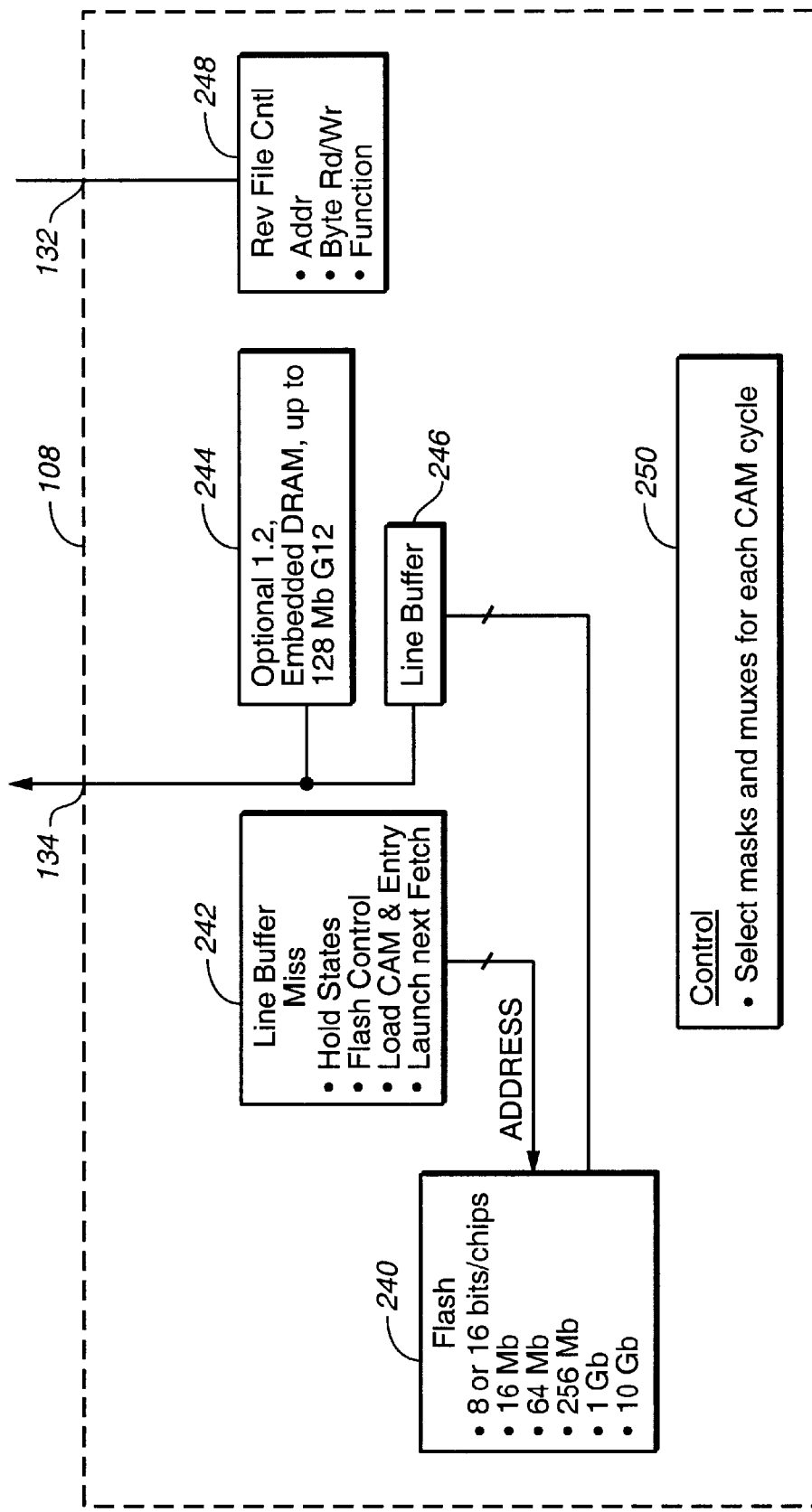
FIG._7

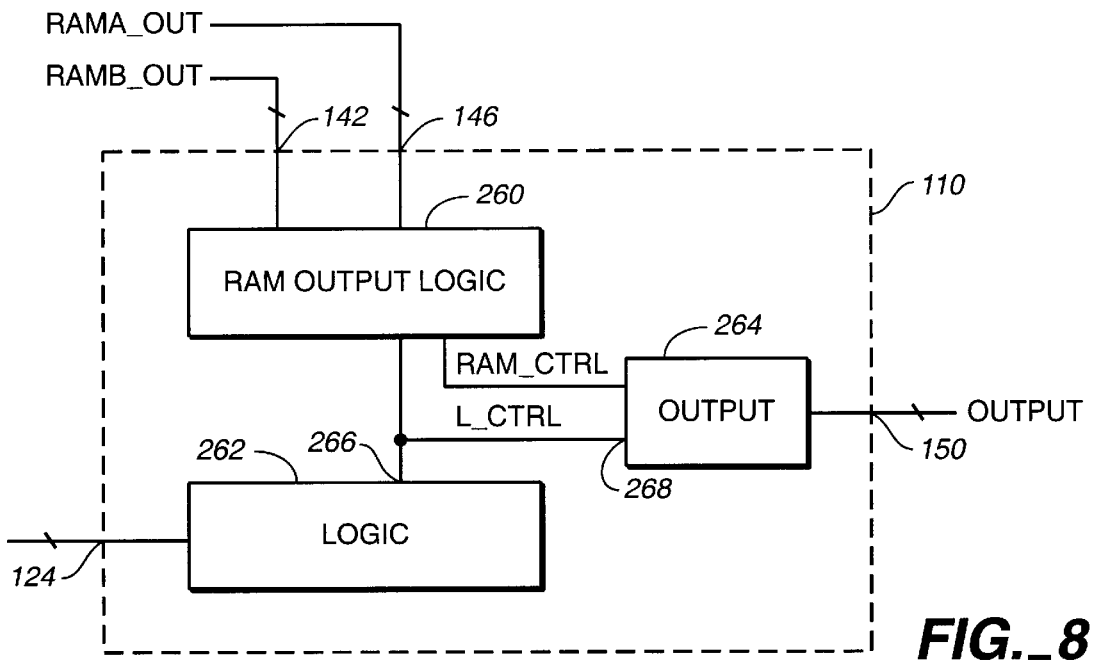
FIG._8
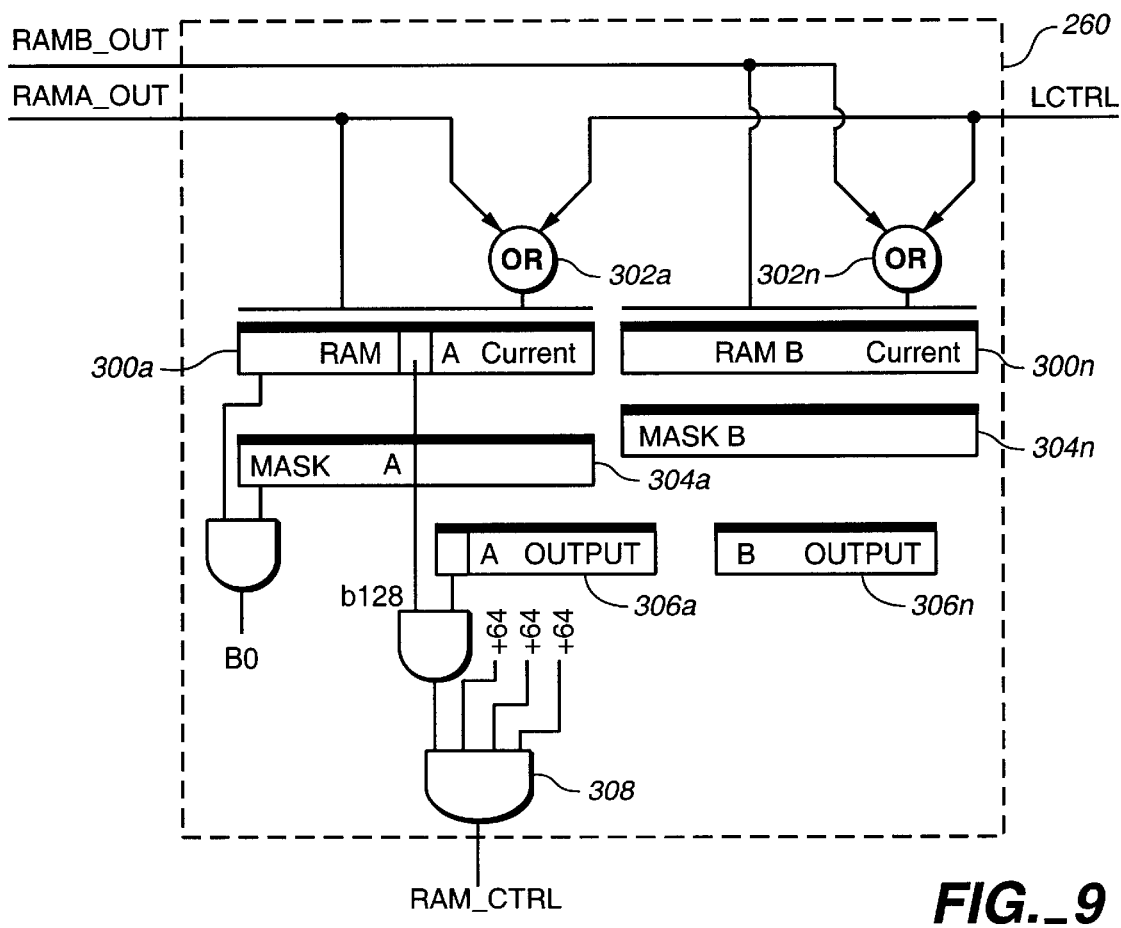
FIG._9

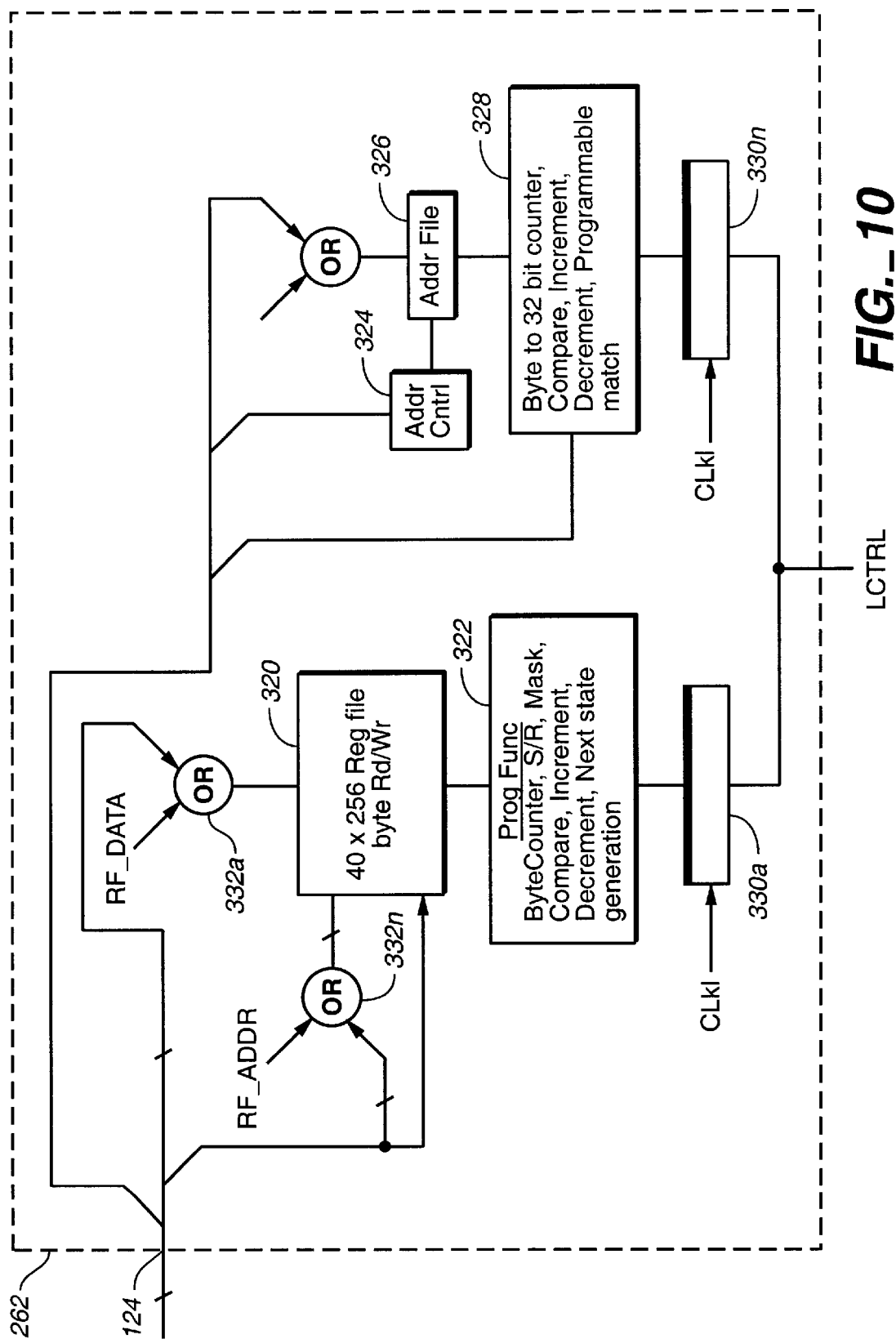
FIG._10

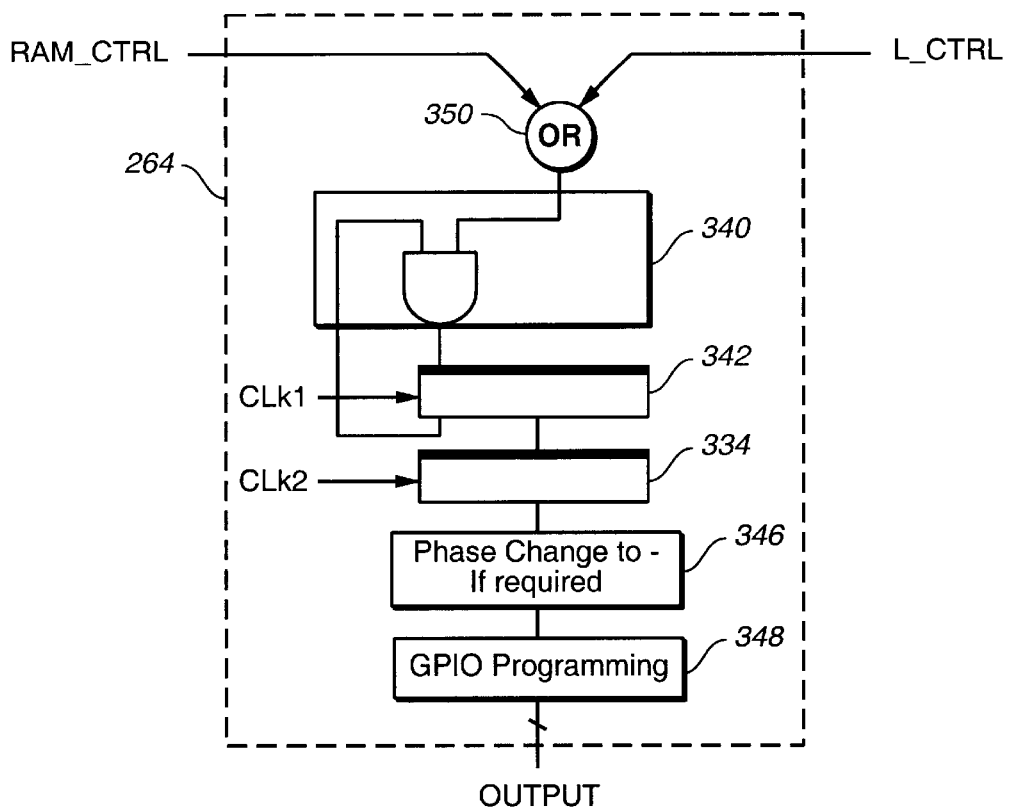
FIG._11
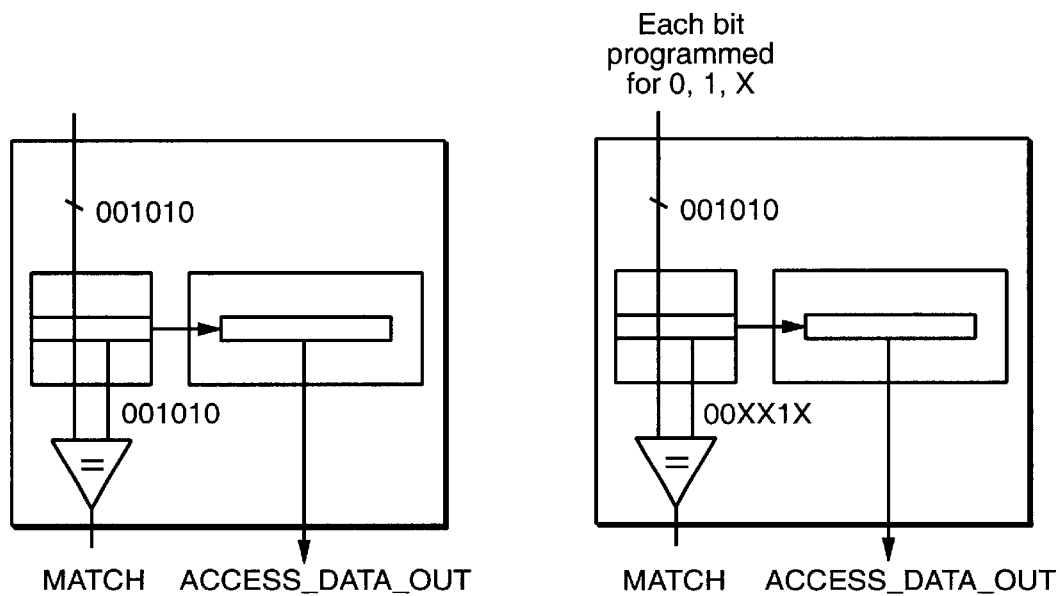
(CONVENTIONAL)
FIG._12
(CONVENTIONAL)
FIG._13

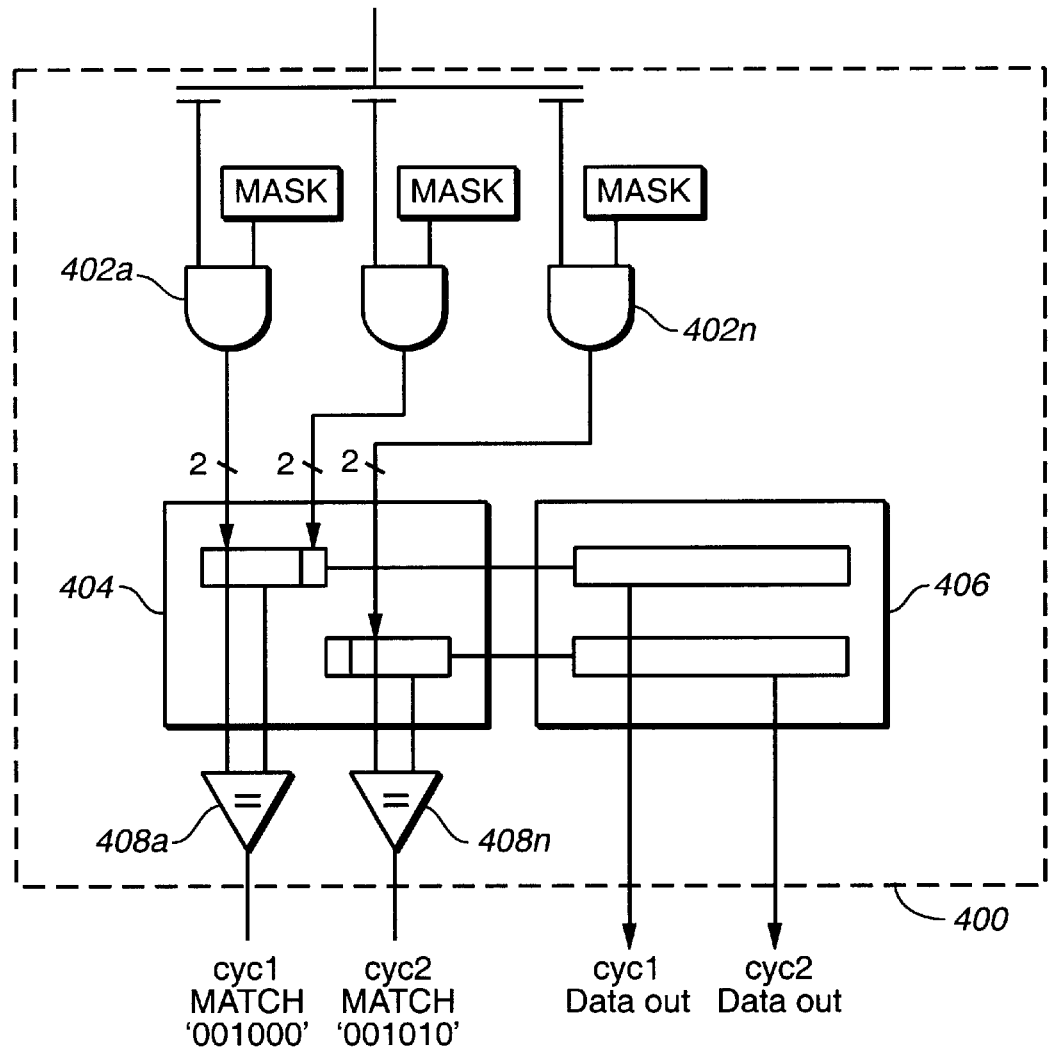
FIG._14

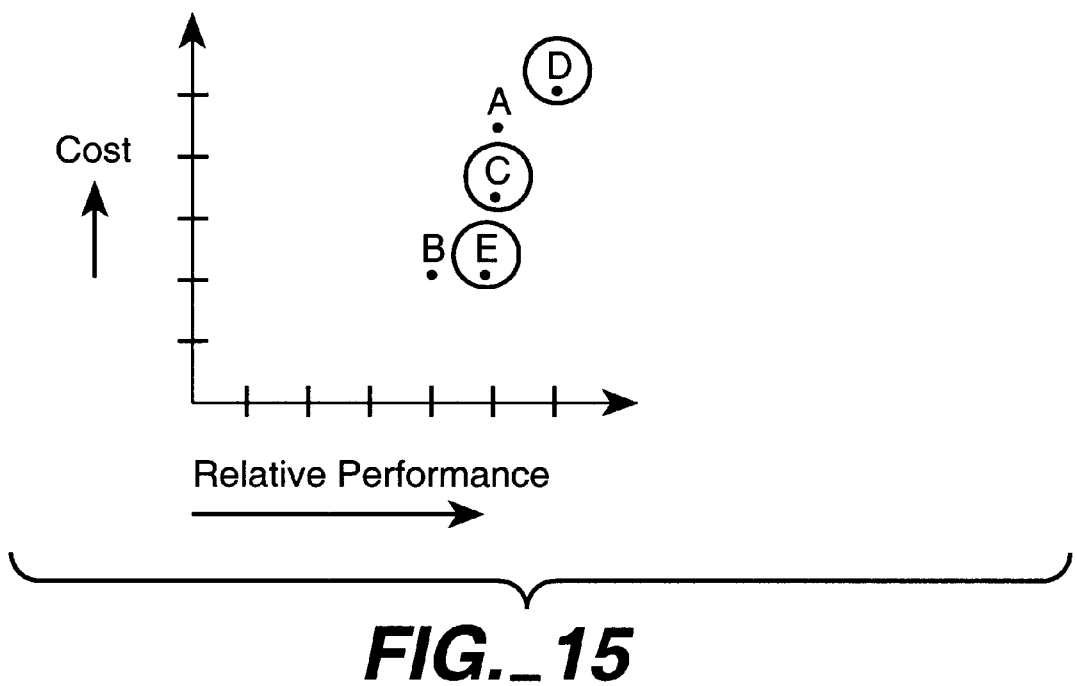
FIG._15

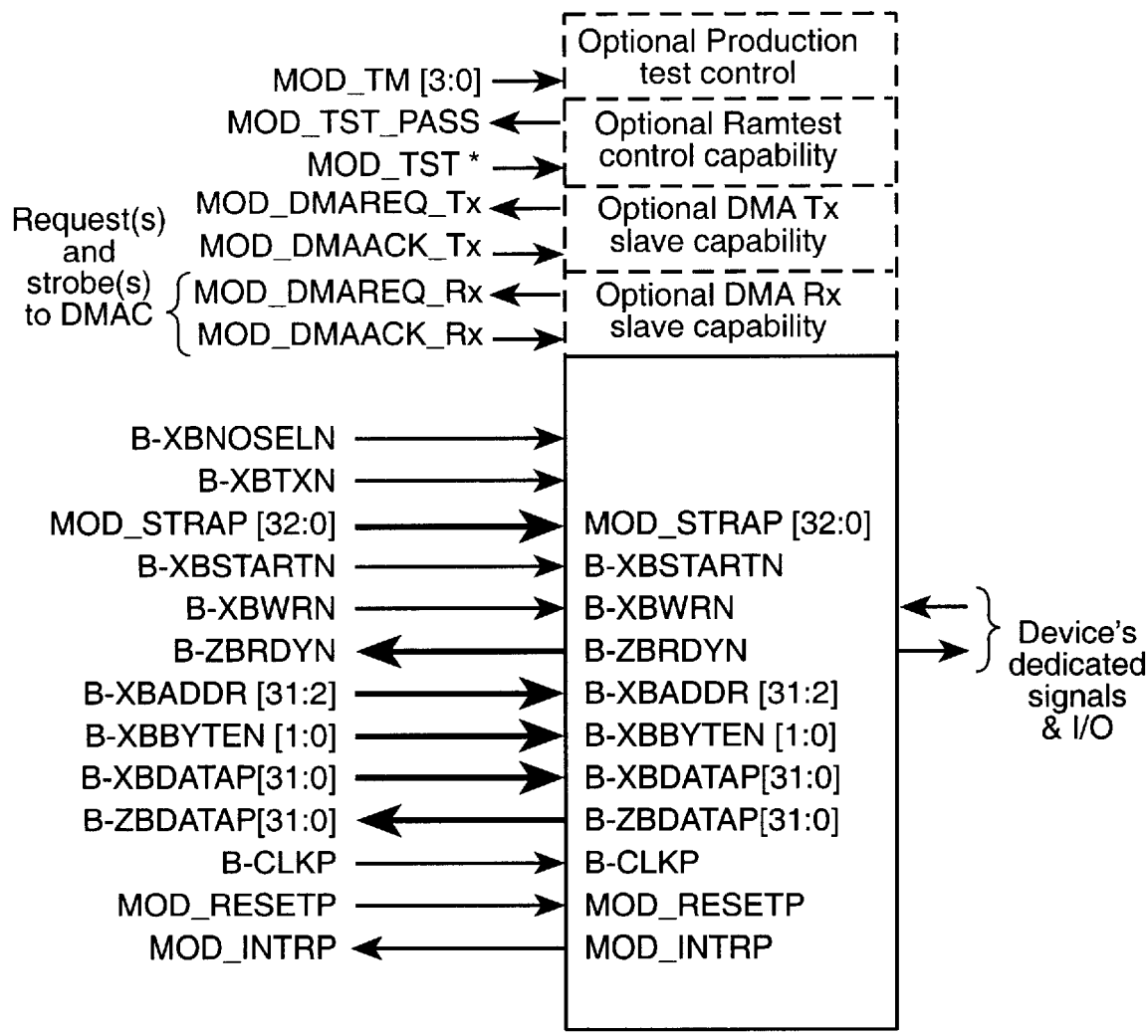
FIG._16

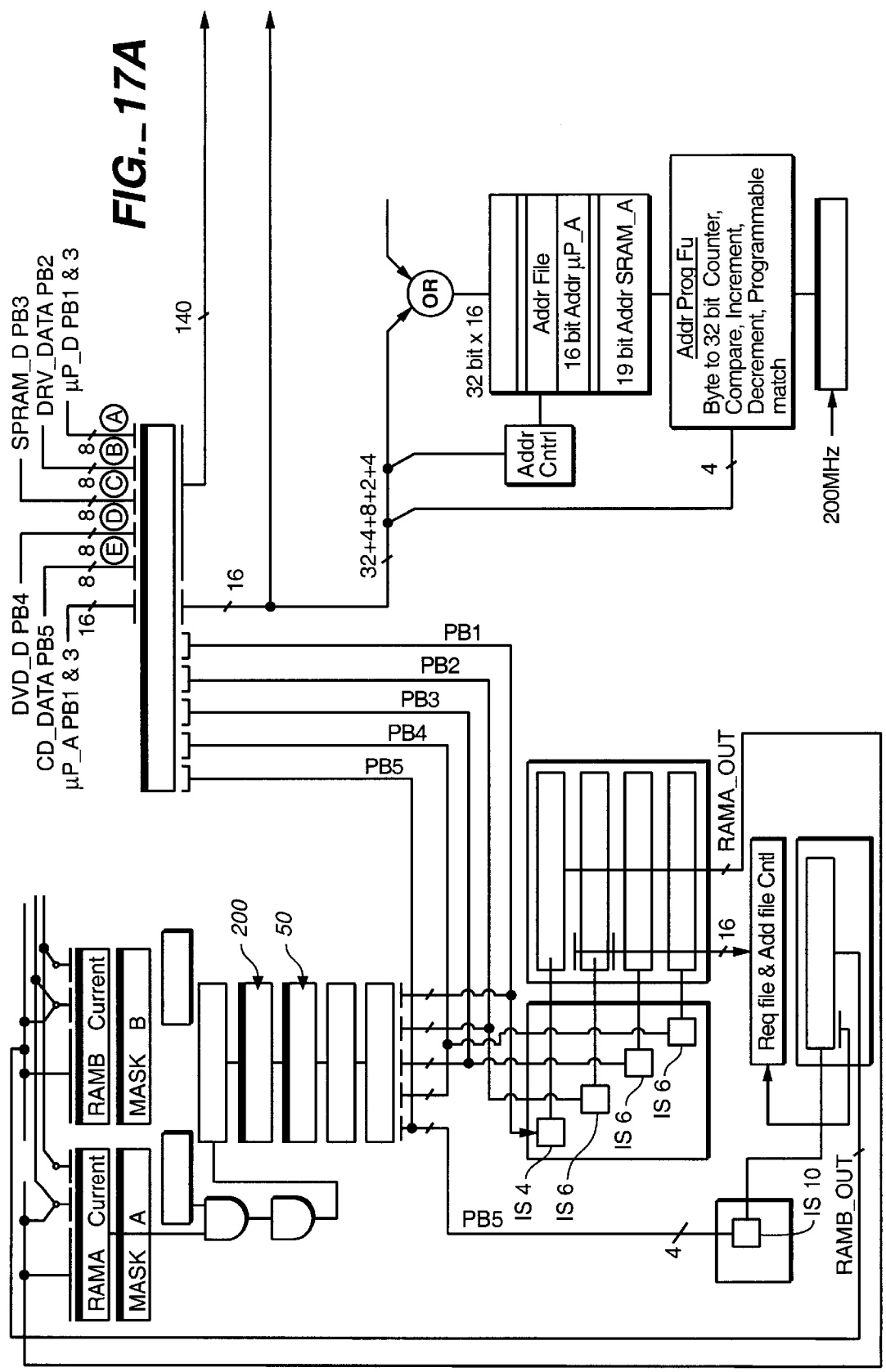

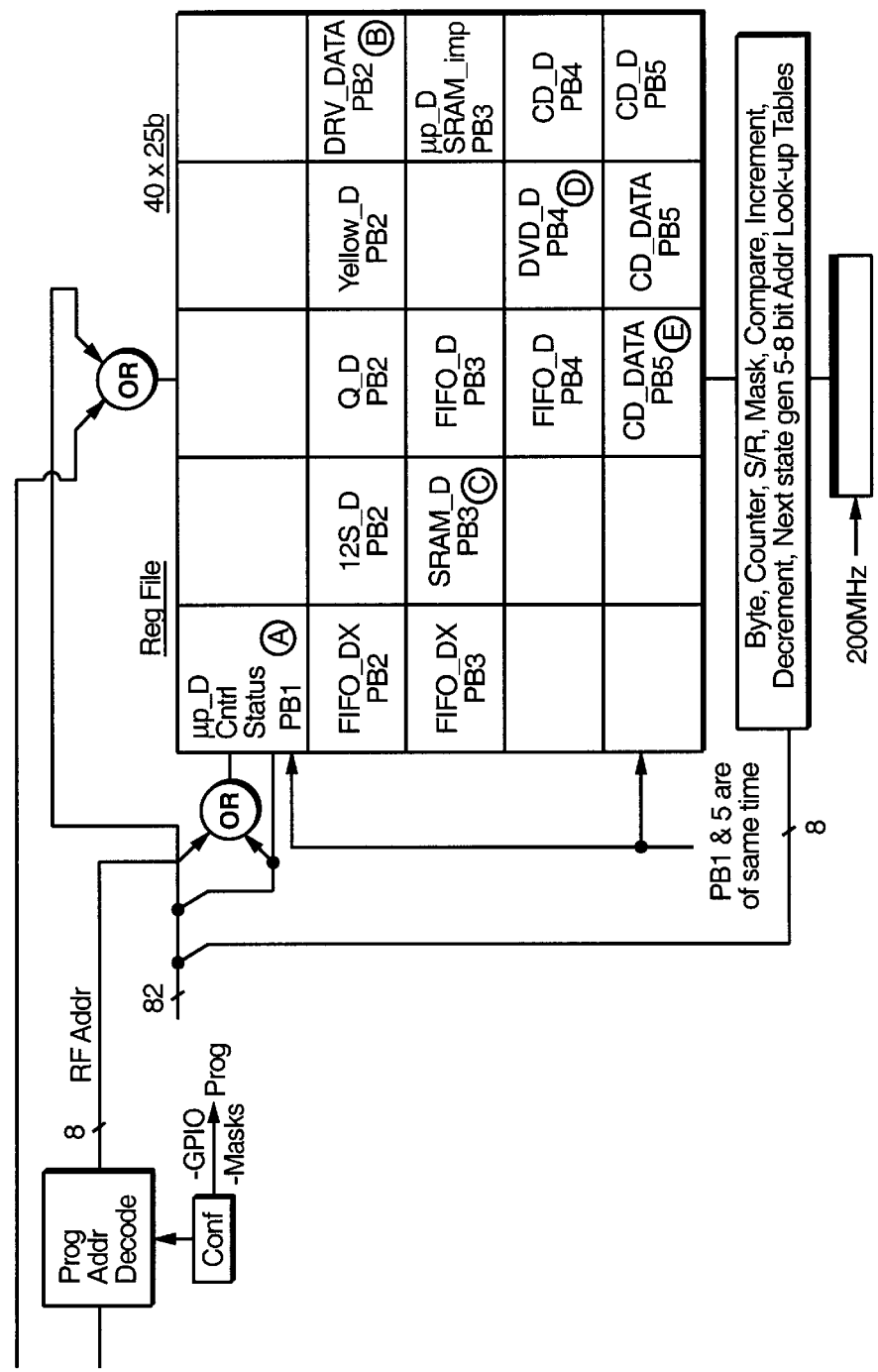

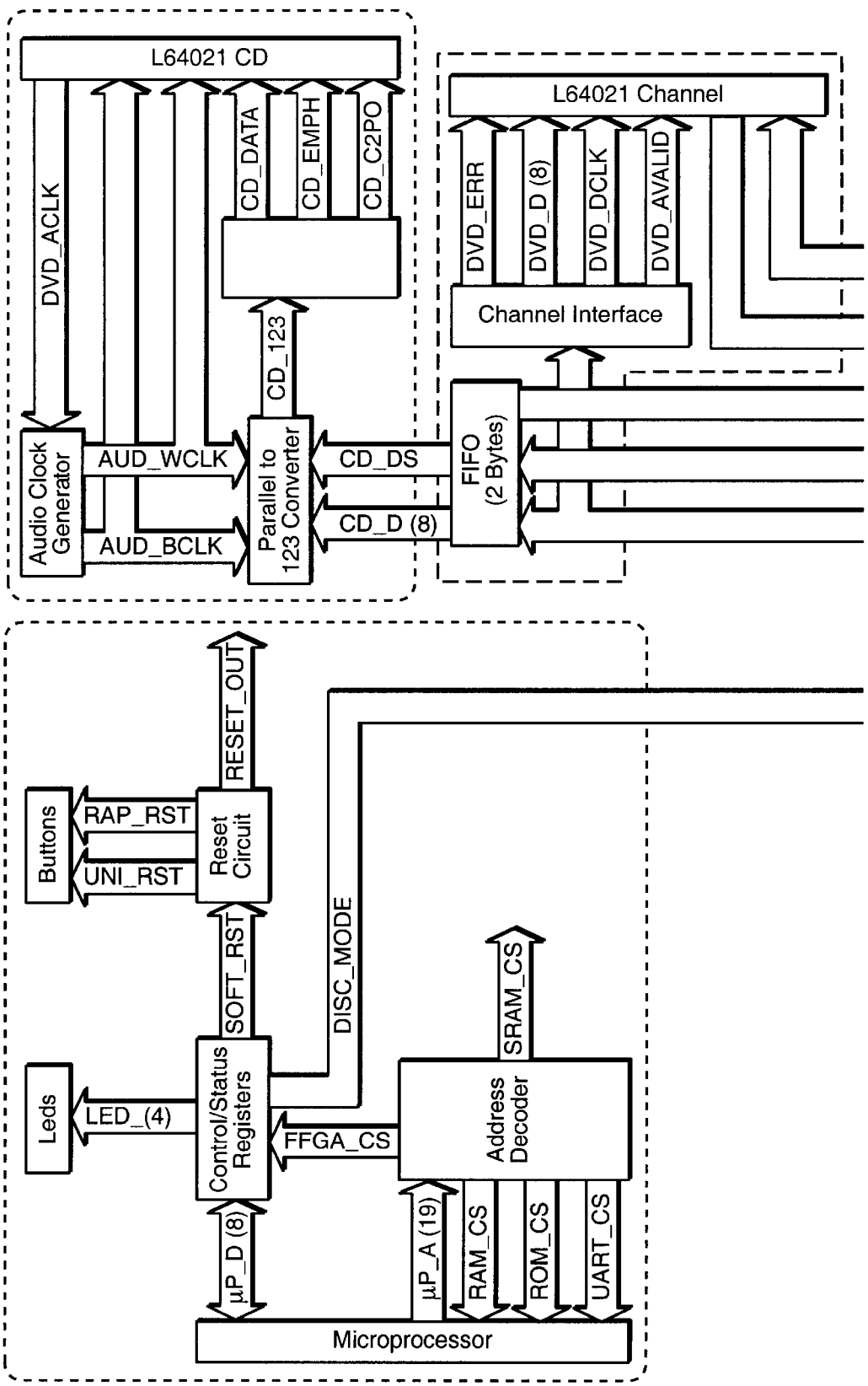
FIG._18A

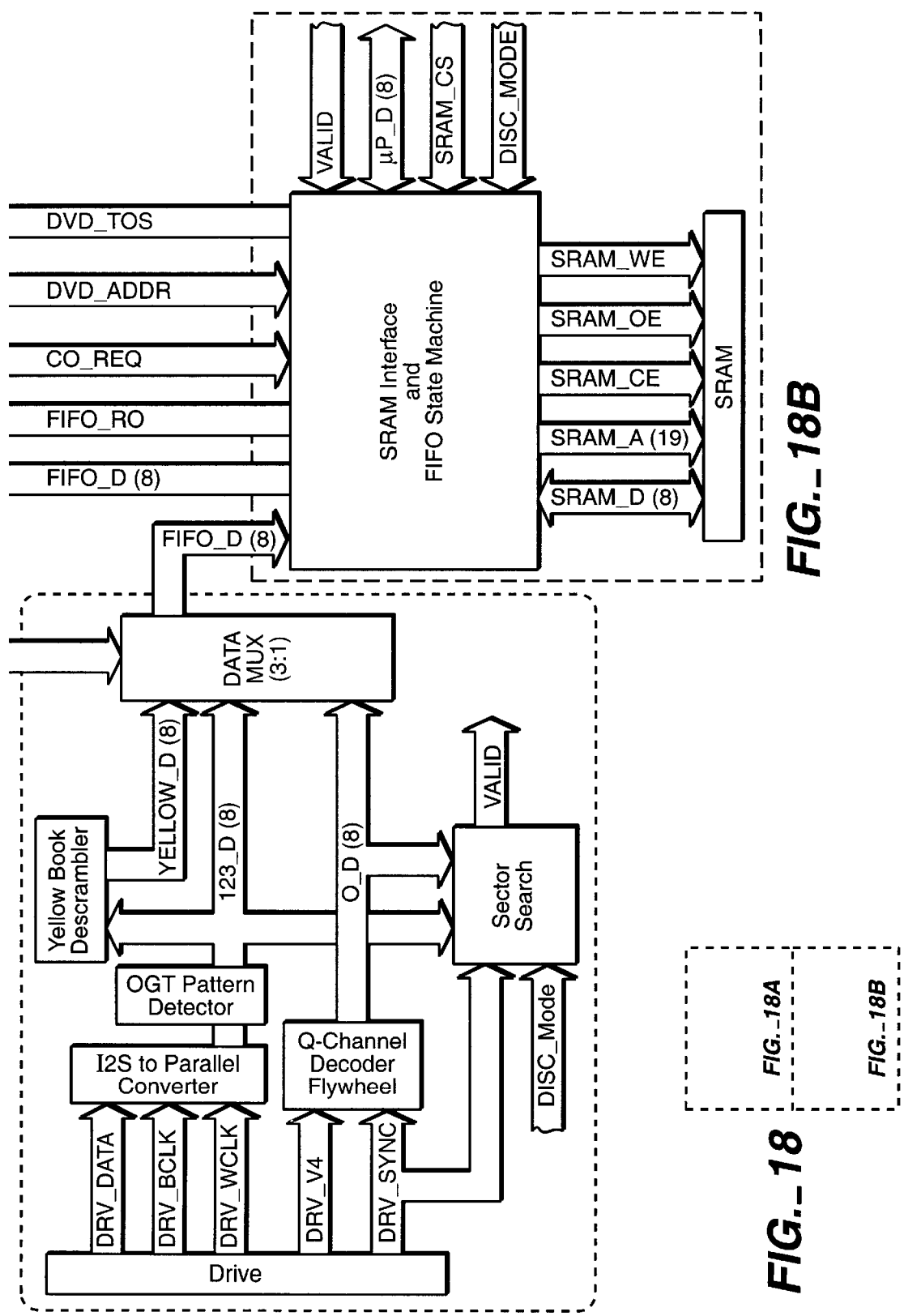

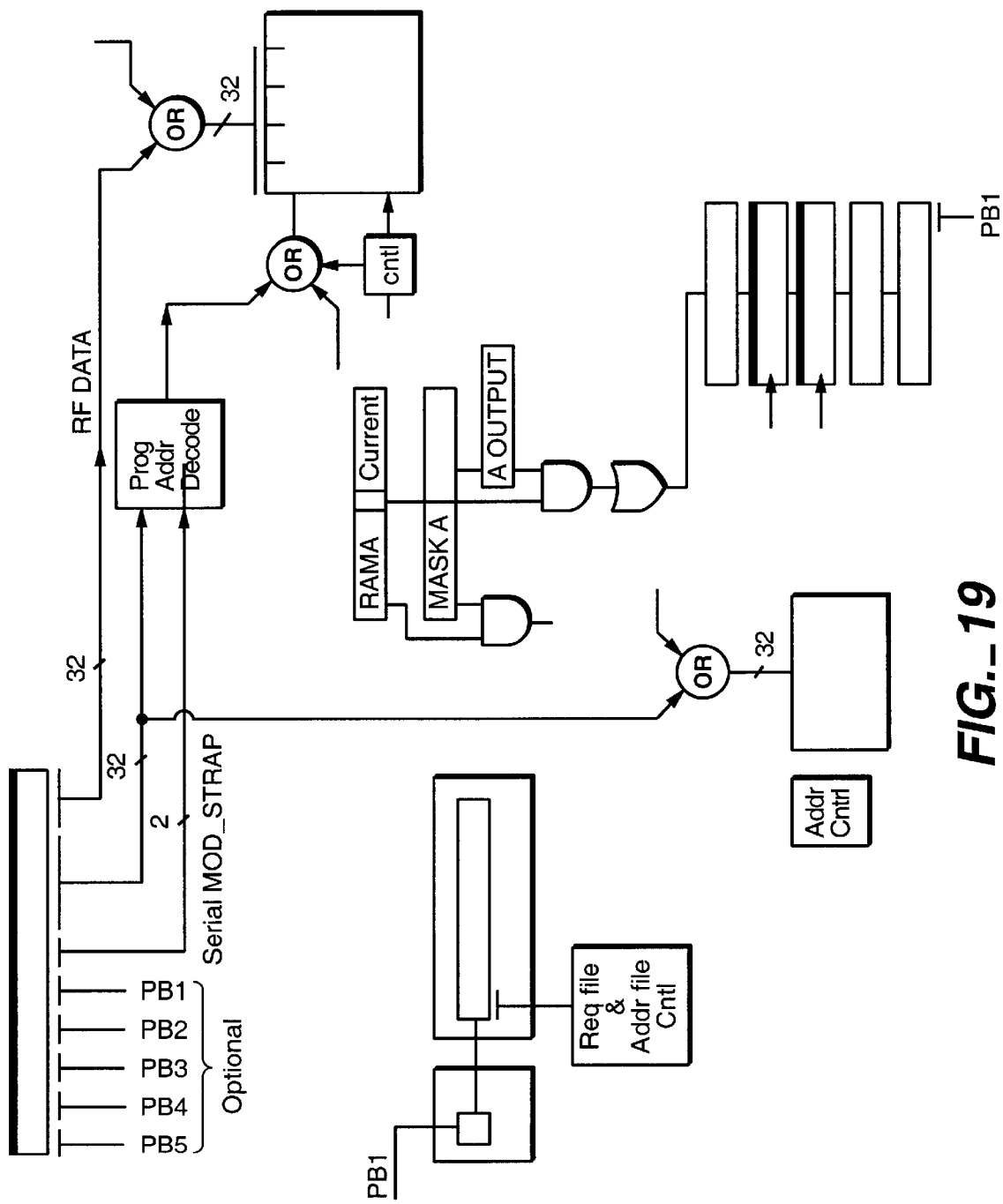
FIG._19

PROGRAMMABLE ASIC

FIELD OF THE INVENTION

The present invention relates to a method and/or architecture for implementing generic applications in an application specific integrated circuit (ASIC) generally and, more particularly, to using a programmable context switching state machine and register file to implement a programmable ASIC.

BACKGROUND OF THE INVENTION

Field Programmable Gate Arrays (FPGAs) and Programmable Logic Devices (PLDs) use programmable interconnects to program a desired function. State machines implemented in RAM or ROM have been used to represent simulation results.

Implementing programmable interconnects can constrain the chip size since the interconnects (i) consume much larger die area for equivalent gates compared to an ASIC, (ii) consume higher power since the interconnect typically has heavily loaded nets, and (iii) incur a higher cost. ROM state machines are constrained to a fixed address space and fixed output width, limiting usefulness to a small number of states.

SUMMARY OF THE INVENTION

The present invention concerns a method and/or software for programming a circuit comprising the steps of (A) simulating one or more states, (B) building program information in response to said simulation and (C) extracting from said simulation one or more unique states having current state to next state sequences.

The objects, features and advantages of the present invention include providing a method and/or architecture that may (i) provide ASICs that may be manufactured at prices competitive with programmable logic solutions, (ii) enable flash memory use that will provide easier boot programming and line buffer miss programming, as well as accommodate larger designs of memories, (iii) allow L2 (Level 2) memory as an option to be fast embedded, providing a wide DRAM, (iv) implement a scalable architecture for small to large cores for standard parts, (v) be implemented in next generation process technology that will enable faster content addressable memory system (CAMS), more process blocks per chip I/O and faster chip I/O functions, and larger and faster embedded RAM, (vi) provide data paths that may be handled by register files, (vii) implement CAM technology with logic that may enable multiple process blocks to use the same entry signals, (viii) extract and process information from simulations to build a program image for a programmable ASIC, (ix) enable optimization of state minimization, (x) partition the states from simulation into process blocks for inputs and internal state sets, (xi) introduce copies of states to multiple process blocks or states to consolidate other states for a process block, (xii) fragment process blocks to pages, (xiii) optionally fragment pages such that input changes are not implemented, (xxv) enable a CAM that may be permanent (e.g., a CAM-ROM), (xv) reduce memory requirements and/or (xvi) reduce power consumption.

BRIEF DESCRIPTION OF THE DRAWINGS

These and other objects, features and advantages of the present invention will be apparent from the following detailed description and the appended claims and drawings in which:

FIG. 1 is a block diagram of a preferred embodiment of the present invention;

FIG. 2 is a detailed block diagram of an input logic block of FIG. 1;

FIG. 3 is a detailed block diagram of a logic block of FIG. 2;

FIG. 4 is a detailed block diagram of a mask logic block of FIG. 1;

FIG. 5 is a schematic diagram of a gate logic block of FIG. 4;

FIG. 6 is a block diagram of a CAM logic and memory block of FIG. 1;

FIG. 7 is a block diagram of a control logic block of FIG. 1;

FIG. 8 is a block diagram of an output logic block of FIG. 1;

FIG. 9 is a detailed block diagram of a RAM output logic block of FIG. 8;

FIG. 10 is a detailed block diagram of a logic block of FIG. 8;

FIG. 11 is a detailed block diagram of an output block of FIG. 8;

FIG. 12 is a detailed block diagram of a conventional CAM block;

FIG. 13 is a detailed block diagram of a ternary CAM block;

FIG. 14 is a detailed block diagram of the invention's CAM block;

FIG. 15 is a graph illustrating the advantages of the present invention;

FIG. 16 is a block diagrams illustrating an implementation of the present invention;

FIG. 17 is a block diagram illustrating an implementation of the present invention;

FIG. 18 is a block diagram illustrating an implementation of the present invention; and FIG. 19 is a block diagram illustrating a generic implementation of the present invention.

DETAILED DESCRIPTION OF THE PREFERRED EMBODIMENTS

Referring to FIG. 1, a block diagram of a circuit 100 is shown in accordance with a preferred embodiment of the present invention. The circuit 100 generally comprises an input logic block (or circuit) 102, a mask logic block (or circuit) 104, a CAM logic block (or circuit) 106, a control logic block (or circuit) 108 and an output logic block (or circuit) 110. The input logic block 102 may have an output 112 that may present a signal (e.g., RF_DATA), an output 114 that may present a signal (e.g., RF_ADDR) and an output 118 that may present a signal to an input 120 of the mask logic block 104. The signals presented at the outputs 112, 114 and 116 may be multi-bit signals.

The mask logic block 104 may have an output 122 that may present a signal to an input 124 of the output logic block 110, and an output 126 that may present a number of signals to an input 128 of the CAM logic block 106. The CAM logic block 106 may have an output 130 that may present a signal to an input 132 of the control logic block 108. The control logic block 108 may have an output 134 that may present a signal to an input 136 of the CAM logic block 106. The CAM logic block 106 may also have an output 140 that may present a signal (e.g., RAMA_OUT) to an input 142 of the output logic block 110 and an output 144 that may present a signal (e.g., RAMB_OUT) to an input 146 of the output logic block 110. The signal RAMA_OUT and the signal RAMB_OUT may be implemented as multi-bit signals.

The output logic block 110 may have an output 150 that may present a signal (e.g., OUTPUT) in response to the signal RAMA_OUT, the signal RAMB_OUT, and the signal received at the input 124. The present invention may provide an architecture for implementing broad applications in an ASIC, using, for example, programmable context switching state machines and register files. The architecture of the present invention may be implemented without programmable interconnects. The present invention may implement in-system programming that may allow JTAG, scan and other techniques to program the circuit 100.

Referring to FIG. 2, a detailed diagram of an example of the input logic block 102 is shown. The input logic block 102 generally comprises a GPIO (e.g., global programmable input/output) programming block (or circuit) 160, a phase change block (or circuit) 162, a current input block (or circuit) 164, a logic block (or circuit) 166 and a register block (or circuit) 168. The input logic block 102 may present the signal RF_DATA and the signal RF_ADDR at the outputs 112 and 114, respectively. In general, any unshared entry bits cannot use a zero value. Also, any shared bits generally only use one cycle and can use a zero value for unique access.

Referring to FIG. 3, a more detailed diagram of an example of the logic block 166 is shown. The logic block 166 generally comprises a number of lookup tables 170a–170n and a number of programmable mask blocks (or circuits) 172a–172n.

Referring to FIG. 4, a detailed diagram of an example of the mask logic block 104 is shown. The mask logic block 104 generally comprises a mask block (or circuit) 200, a block (or circuit) 202, a number of gates 204a–204n, and a number of gates 206a–206n. The block 200 may comprise a gate logic portion (or circuit) 208. The mask logic block 104 may mask a number of inputs with the gates 204a–204n. The gates 206a–206n may select an appropriate output to be presented at the outputs 126a–126n.

Referring to FIG. 5, a circuit diagram of an example of the gate logic block 208 is shown. The gate logic block 208 generally comprises a number of gates 210a–210n, a gate 212 and a gate 214. Each of the gates 210a–210n generally receive an unmasked signal (e.g., S0–S3) and a masked signal S0–S3. The gate logic block 208 generally presents a signal (e.g., B0) to one of the gates 206a–206n. The blocks 200 and 202 may also include a similar gate logic block 208.

Referring to FIG. 6, a block diagram of an example of the CAM logic block 106 is shown. The CAM logic block 106 generally comprises a number of CAM blocks (or circuits) 220a–220n and a number of RAM blocks (or circuits) 222a–222n. Each of the CAM blocks 220a–220n may receive a signal from the mask logic block 104 from the inputs 128a–128n. Each of the RAM blocks 222a–222n may receive a signal from the control logic from the input 136 and the output 130. The CAM logic block 106 generally presents the signals RAMA_OUT and RAMB_OUT at the outputs 140 and 144, respectively.

Referring to FIG. 7, a diagram of an example of the control logic block 108 is shown. The control logic block 108 may comprise a flash block (or circuit) 240, a line buffer miss block (or circuit) 242, a cache block (or circuit) 244, a line buffer block (or circuit) 246, a register file control block (or circuit) 248 and a control block (or circuit) 250. The flash block 240 may be implemented in a number of memory sizes (e.g., 8 Mb, a 64 Mb, a 256 Mb, a 1 Gb, a 10 Gb, etc.) of flash memory in order to meet the design criteria of a particular implementation. The line buffer block 242 may hold current states, may control the flash block 240, may load a CAM entry and may launch a next fetch. The cache block 204 may be implemented as an optional level 2 cache. Additionally, the cache block 244 may be implemented as an embedded DRAM. The control block 250 may select the particular mask and multiplexers for each CAM cycle. The register file control block 248 may provide addressing, byte read and write functions, and other functions necessary to meet the design criteria of a particular implementation.

Referring to FIG. 8, a block diagram of an example of the output logic block 110 is shown. The output logic block 110 generally comprises a RAM output logic (or circuit) 260, a logic block (or circuit) 262 and an output block (or circuit) 264. The RAM output logic block may present a signal (e.g., L_CTRL) to an input 266 of the logic block 262 as well as to an input 268 of the output block 264. The RAM output logic block 260 may also present a signal (e.g., RAM_CTRL) to the output block 264.

Referring to FIG. 9, a more detailed diagram of an example of the RAM output logic block 260 is shown. The RAM output logic block 260 generally comprises a number of RAM circuits 300a–300n, a number of logic circuits 302a–302n, a number of mask circuits 304a–304n and a number of output circuits 306a–306n. A RAM output logic block 308 may receive an input from one of the RAM circuits 300a, one of the mask circuits 304a and one of the output circuits 306a and may generate the signal RAM_CTRL.

Referring to FIG. 10, a more detailed diagram of an example of the logic block 262 is shown. The logic block 262 generally comprises a register file block (or circuit) 320, a program function block (or circuit) 322, an address controller block (or circuit) 324, an address file block (or circuit) 326, a function block (or circuit) 328, and a number of output blocks (or circuits) 330a–330n. A number of logic gates 332a–332n may receive one or more of the bits of the signal received at the input 124. The program function block 322 may implement one or more of the following functions: a byte counter, a set or reset, a mask, a compare, an increment, a decrement and/or a next state generation. The block 328 may implement one or more of the following functions: a byte to 32 bit counter, a compare circuit, an increment circuit, a decrement circuit, a programmable match circuit, etc.

Referring to FIG. 11, a more detailed block diagram of the output block 264 is shown. The block 264 generally comprises a logic section (or circuit) 340, a block (or circuit) 342, a block (or circuit) 344, a phase block (or circuit) 346 and a programming block (or circuit) 348. The blocks 342 and 344 may be implemented, in one example, as timing blocks that may receive a clock signal CLK1 and CLK2, respectively. A logic gate 350 may present a signal to the block 340 in response to the signals RAM_CTRL and L_CTRL.

Referring to FIGS. 12 and 13, diagrams of the various CAM devices are shown. FIG. 12 illustrates a conventional CAM block and FIG. 13 illustrates a ternary CAM block. A ternary CAM is a 3-state CAM, where x is used as well as 0 and 1 (that is, if a CAM bit is an x, this is a match). In certain design applications, ternary CAMS may be implemented. Ternary CAMS may be used on a node in a communication network to quickly identify if the incoming address is the nodes. Each entry in the CAM may have bits programmed to recognize a 0,1,x for a match. However these CAMS are 40% larger than traditional CAMS because of this feature. Example ternary CAMS may be SiberCores, Sibercam family or NetLogic IPCAM family.

Referring to FIG. 14, a detailed block diagram of a CAM block is shown. The CAM block 400 generally comprises a number of gates 402a–402n, a block (or circuit) 404, a block (or circuit) 406, and a number of output buffers 408a–408n. The output buffers 408a–408n may present a number of signals (e.g., CYC1–CYC2). The block 406 may present a signal CYC1_DATAOUT and a signal CYC2_DATAOUT.

Referring to FIG. 15, an example illustrating the savings that may be realized by the present invention is shown. Item E may represent the best performance/price selection, at the example price of $5.86. This may include an embedded DRAM for the line buffer and L2 cache. The compiler may build multiple pages and line buffer miss may be implemented as a fast L2 access on-chip. The circuit generally provides a price break over architecture options.

The present invention may enable a standard part family to capture a large percentage of the programmable logic market. The circuit 100 implementing CAM with an embedded RAM may compete with FPGAs in the programmable logic market. The circuit 100 with CAM-ROM may compete with volume PLDs (e.g., one-time programmable and lowest cost). With bond options on a die, different packaging types may be supported with a single high volume design to ensure a substantial initial (e.g., 100K) units of sales. Programmable ASIC technology in accordance with the present invention (e.g., scaled cores in consumer standard parts) may only add a modest few dollars in cost, and may enable positioning of the parts as earlier prototypes and longer life, since changes may be made after fabrication. Such postproduction fabrication may reduce part respins and part derivatives, and may save a substantial amount of development cost. Additionally, customers may add differentiating functionality.

The circuit 100 may have applications in multiple cycle CAM use per chip cycle. For example, CAM cycles may share entry bits for gathering multiple cycles in a single CAM. Such an implementation may enable broad programmability of what constitutes an entry bit in terms of inputs and internal states. The circuit 100 may be implemented in a process of programming PASIC (Programmable ASIC) from simulation information. The circuit 100 may provide a scalable architecture from small core to large chip for implementing a programmable ASIC.

The circuit 100 may be made up of CAMS, line buffers, register files, state registers, mask registers, GPIO, logic, LUT (look-up tables), optional L2 cache and line buffer miss logic. Certain process technologies may have 200 MHz 128X8K entry CAMS. Such CAMS may be accessed 4 times per chip clock cycle. The GPIO block 160 may be configured using any combination of 128 inputs and 128 outputs, including bidirectional input/outputs. With each of the CAMS accessed up to 4 times per chip clock cycle, up to 8 process blocks may be processed in a chip clock cycle. The RAM 222a (e.g., A) and the RAM 222n (e.g., B) may be, in one example, 256-bits in width. Up to 500 register values (e.g., typically non-data information since data would be handled by the register files) may be stored.

The programmable mask registers 200,222 and 304a–304n may hold mask values for CAM entry signals for each process block. The first 50 inputs of the 128-input CAM may be implemented as inputs segmented into groups of, for example, 50. The rest of the 128 inputs may be internal states segmented into groups of, for example, 80. Register files may be written directly from the inputs. The output of the registers may have programmable functions that may be performed on a select register. The address register file may also have programmable functions that may be performed on a select register. The signal OUTPUT may be programmably masked from groups of 64 and may feed a 50 MHz register for outputting to the chip I/O. The phase of the output may, in one example, be programmed. The GPIO 160 is generally programmed as an output or as a bidirectional input/output. On the chip inputs, the GPIO 160 is generally programmed as an input or as bidirectional input/output. In one example, the phase of the input may be programmed.

Performance enhancements provided by the circuit 100 may include deeper CAMS, more CAM-line buffer sets, L2 RAM, DRAM over SRAM for an embedded design that may provide more line buffer memory per given area, and/or faster CAMS to enable more process blocks per chip clock cycle. Typically, more process blocks may produce greater reduction in CAM entries, but more I/O and internal state fragmentation. In one example, an embedded Flash may be implemented with the present invention that may have performance comparable to embedded DRAM and will reduce overall cost, since no off-chip Flash may be needed.

The CAMS may be implemented as traditional, wide, deep, lowest gate count possible CAMS that may achieve a 200 MHz operating speed. The data for match is programmably masked on each CAM cycle, such that the CAM bit range not used may have values of zero. Such an implementation may enable the unique feature of having multiple process blocks that may use the same CAM data entry bit(s). The CAMS may (i) enable efficient use of the width of the CAM, (ii) make a programmable number of inputs and internal states per process block and (iii) have multiple process blocks per chip clock cycle.

Referring to FIG. 16, an example of a generic module is shown. Such a module may be used to drive reuse methods. The circuits of the present invention have broad applicability. The circuit 100 may provide a generic, scalable device that may be performance/cost competitive with programmable device standard parts. The circuit 100 may be used like an FPGA core on an ASIC or as a programmable standard part. The right side of the module may be used to connect a number of legacy fixed cores together, as an example application, to make a large core. FIG. 19 is a PASIC implementation of FIG. 16.

Referring back to FIGS. 17–19, circuits implemented using the present invention is shown. Less than 50 signals are used on CAM A and only 14 signals are used on CAM B. The example shown in FIG. 17 is a data processing intensive application. A compiler implementation design model for the PASIC may be implemented by (i) mapping data to a 4 cycle/chip access register file, after a process block fragmentation, (ii) maintaining an old and a new register for the chip clock, and (iii) implementing any chip input or internal state that is a CAM input as part of any PB. FIG. 17 is a PASIC implementation of FIG. 18.

In one example, the circuit 100 may be implemented as a core on a system on a chip (SOC). In prototypes, the circuit 100 may be used to add functionality or to implement bug fixes. Bug fixes may be limited by accessibility of the I/O to the area with the bug. The core may be used to stitch together existing cores. Such an implementation may avoid forcing existing cores to be re-designed to accommodate different interfaces. Customers may develop additional functionality to the SOC using this programmable area. Once the programmable implementation is stable, an option may be provided to move to embedded ROM for high volume. Such an implementation may eliminate the off-chip flash, and optionally the line RAM on-chip, and may typically reduce implementation cost (e.g., a 50% cost reduction).

The circuit 100 may be implemented as a core on core-based lead vehicle. Evaluating lead vehicles of cores being developed or modules being developed, may benefit from the circuit 100. A processor lead vehicle with the circuit 100 as a core may enable a variety of interfaces to be supported with the same part.

The circuit 100 may be implemented as a standard part. Such standard parts may be offered with a software package that may be implemented with simulation output. Since the standard parts may be implemented in a variety of applications and design implementations, yet use the same part, high volumes may be achieved above target margins with no non-recurring engineering (e.g., NRE) costs passed to the customer. The circuit 100 may leverage the cell-based ASIC strengths of (i) density, (ii) low-cost, (iii) low-power, and/or (iv) volume in an original architecture that may use more gates to implement an equivalent programmable function, but enable full programmability. Such an implementation may enable participation of a huge market for which no ASIC vendor has been able to participate. The ASIC technology may become available again for <25 Kg designs.

Optionally, to instantly wedge open the market, the HDL/netlist/sims from existing competitors designs may be targeted. Some of these designs use generic tools. A tool for automating such conversion using the PASIC compiler technology may be developed. In one high volume, low cost implementation, the CAM and embedded RAM may be converted to a ROM once the design is stable and, moving to high-volume, will lower the cost and size by about 50%.

The programmable ASIC circuit 100 generally represents a different implementation of gates than FPGAs or PLDs. The circuit 100 may represent the gate design as a comprehensive set of flip-flop, latch and memory state vectors in memory that are accessed in the proper sequence. The one exception to this is complex data, which can be handled through register files on the circuit 100. Typically, programmable devices are used for control and not data processing, so the architecture of the circuit 100 is control friendly. Cell-based ASICs may have significant cost, power and density advantages over FPGAs and PLDs, but cannot be programmed, and thus are targeted to high-volume products.

FPGAs and PLDs are essentially blocks of logic with complex, programmable, power consuming interconnects. The circuit 100 is an architecture that may use the strengths of cell-based ASICs to implement programmable logic, without the interconnect issues of FPGAs or PLDs.

The following steps may be used for programming the circuit 100 (i) the design is generally comprehensively simulated for all relevant states: (ii) the PASIC compiler is generally implemented to assess simulation and to build program information; and (iii) the PASIC compiler may extract from simulation all the unique states with all possible current state to next state sequences including the effects inputs have Statistics on the number of registers, the number of unique states, the number of inputs, the number of outputs, the number of input phases, the number of output phases, and the number of unique clock cycle states may be gathered. Then, the compiler may partition, with the help of the user, certain states and inputs into process blocks. In one example, the programmable ASIC circuit 100 may allow up to 8 process blocks per chip clock cycle. The CAM A with line buffer A may support 4 process blocks. The CAM B with line buffer B may support 4 process blocks. Each process block may have a programmably masked set of entry signals. Each line buffer entry may have a register file and multiplexer control.

A process block may be accessed on an independent access to the CAM. A CAM is generally a content addressable memory that state and input signals access. If there is a match, the line of data from memory (on-chip SRAM or DRAM) may be accessed. This access may represent the relevant next state. Multiple CAM accesses may occur per chip I/O cycle, making these micro-cycles. The micro-cycle states are generally continually loaded on each micro access to the CAM and affiliated memory. Therefore, the next states generally cannot be effected by the other process block next states.

Optionally, the next states may be represented as a delta to the existing states, reducing the need for line of data memory. Additionally, the compiler may introduce copies of states to multiple process blocks or states to consolidate other states for a process block. The compiler may optionally make state reduction recommendations. The gate netlist may be changed and simulation re-run to verify such recommendations. A re-compile may implement the reduced state representation of the design.

Optionally, the compiler, with user interaction, may fragment process blocks to pages. The L2 cache 244 (shown in FIG. 7) may be Level 2 memory. The L2 cache 244 may hold alternative page information that may be quickly accessed.

The compiler may build the CAM entry table, embedded memory line entry vectors, and/or configuration control information tables. The configuration sets are generally control sets for the register file, the select masks 200 and 222, the GPIO block 160, the multiplexers 302a–n, the multiplexers 332a–n and the multiplexer 350.

If the process block states are beyond what is available in the CAM, and there is no L2 cache implemented, a line buffer miss capability may be used. The line buffer capability may access flash from off-chip in the event of a miss. The access to flash may be as fast as a single access of delta from existing state info, with new input, using a 16 bit flash access. The likely worse case is a flash device that operates at 20 MHz with an 8-bit access. On a 256-bit width line entry, such an access would take 1.6 μsec, or 80 50 MHz chip clock cycles. If the line buffer miss, to line refill, to complete process block access, is longer than a chip I/O cycle, the circuit 100 may need to be able to handle this at the board level. In such cases, the compiler can generally be constrained to what process block pages are local and what lines are accessed off chip. The off-chip flash may be programmed with the boot information. During a board reset, the programmable PASIC 100 may boot from flash, filling the CAM, embedded memory, and configuration control. After such a boot, normal operation begins.

The circuit 100 may provide an architecture that may enable ASICs to be a competitive programmable logic solution in the market, without interconnect issues. Such a solution is a sustainable position, since cell-based technology with CAMS, RAM, register files and state machine logic will always take up less area and (less cost) than an equivalent function in an FPGA.

The circuit 100 may allow design scales to particular market direction and application needs. Denser, cheaper Flash will make boot programming and line buffer miss programming easier. Larger designs may be accommodated (e.g. the number of control simulation states stored). The L2 cache memory 244 is an option that may be implemented as a fast embedded, wide DRAM. Embedded DRAM is a emerging trend. Embedded memory may add to the density and cost effectiveness of the programmable ASIC circuit 100 versus FPGAs.

The circuit 100 may enable scalable architecture for small to large cores to standard parts. Larger architectures may be used with power consumption sized to the particular application. Multiple small architectures may be used to implement a single application. Multiple large ASIC circuits 100 may be used to implement full systems.

Next generation process technology will enable faster and larger CAMs, for more process blocks per chip I/O and faster chip I/O function. Further, the next process will enable more and faster embedded RAM, which may further improve the functionality of the circuit 100.

The data paths may be handled with register files that may be loaded or read from (and processed by) the state entries in the line buffer 246. CAM technology may be implemented with logic that enables multiple process blocks to use the same entry signals, at a smaller size than ternary cams. Applying the teachings of the present invention to multiple process blocks sharing entry signals may enable much of the programmability of the circuit 100.

The compiler technology may be implemented that may enable optimization of state minimization, emulation of states to minimize memory and cycles needed in the implementation of the circuit 100. Certain internal states may be redundant or not necessary from the chip I/O perspective, and therefore may be eliminated or optimized, such as blending with other state(s).

The compiler technology may be implemented that may partition the states from simulation into process blocks for inputs and internal state sets, that are then implemented in CAM-line buffer entries. State extraction may be implemented in CAM-line buffer entries as process block full state representation, partial state representation, or wait state (e.g., change when input or internal state that is relevant changes, or timeout occurs). A partial state representation may be delta from a previous state. Process block partitioning, with the architecture, may be implemented where CAM entry signals may be shared between process blocks.

Compiler technology may be implemented that may introduce copies of states to multiple process blocks or states to. consolidate other states for a process block. Such compiler technology may fragment process blocks to pages. A given process block will use a number of the 8K CAM entries, but may not necessarily be proportional among the four process blocks (e.g., 25% each). The compiler generally assesses if all four process blocks have all line buffer entries local. If not, the compiler assesses what is overflow, what is likely the least used set of entries, and what the performance needs of these entries are. Low use, alternative pages are then developed for L2 or for off chip memory to hold.

The compiler technology may optionally fragment pages such that input changes are not used. Internal state changes may be used to request access to the next page line buffers. Such an implementation may be predictable when the next page is needed. Therefore, the next page may have a pre-fetch launch, saving time on a line-buffer miss.

The CAM may be made permanent by a CAM-ROM. For example, the content addressable memory may be implemented as a ROM, not a RAM. Such a ROM implementation may reduce size and power of the CAM by, for example, an estimated 50%. If no change in inputs, process block or entire CAM access occurs, a power savings may result. If there are no current or expected change in inputs, and the process block has no output changes needed for x number of clocks, the given process block may suspend CAM access for x number of clocks, which may save power. Other process blocks may keep running.

For a given implementation, sections of CAM and the line buffer may have the internal sense amps (not shown) turned off if unused, which may save power. For example, if only 50 entry signals are used on the cam and 128 bits of RAM A (300a) are used, the rest of CAM A and RAM A and all of CAM B and RAM B (300n) would be turned off, which may save memory.

Programming the present invention may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMS, EPROMS, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. A method for programming an application specific integrated circuit (ASIC) comprising the steps of:

(A) simulating one or more states;

(B) building program information in response to said simulation;

(C) extracting from said simulation one or more unique states having current state to next state sequences; and (D) introducing copies of states to multiple process blocks or states, wherein said multiple states consolidate one or more other states in a process block.

2. The method according to claim 1, wherein said current state to next state-sequences are extracted in response to one or more inputs.

3. The method according to claim 1, further comprising the step of:

representing the next state sequence as a difference from the current state, wherein said representation reduces the need for line of data memory.

4. The method according to claim 1, further comprising the following steps:

generating one or more state reduction recommendations;

changing a gate netlist;

re-running said simulation to verify said one or more state reduction recommendations; and re-compiling to use said one or more state reduction recommendations.

5. The method according to claim 1, further comprising the step of:
   fragmenting one or more process blocks to one or more pages within a compiler in response to one or more user inputs.

6. The method according to claim 1, further comprising the step of:
   building a CAM entry table, one or more embedded memory line entry vectors, and one or more configuration control information tables.

7. The method according to claim 1, further comprising the step of:
   if the blocks or states are beyond what is available in a CAM, and when there is no L2 catche, executing a line buffer miss capability routine.

8. The method according to claim 7, wherein one or more data paths are implemented with one or more register files that are loaded or read from and processed by the state entries in said line buffer.

9. The method according to claim 1, further comprising the step of:
   programming an off-chip flash with a set of boot information.

10. The method according to claim 1, further comprising the step of:
    during a board reset, booting from a flash device, filling the CAM, embedded memory, and configuration control, resuming normal operation.

11. The method according to claim 1, wherein a programmable ASIC compiler extracts information from a simulation and processes said information to build a program image.

12. The method according to claim 1, wherein a process block suspends access to one or more CAMS for a first number of clock cycles in order to save power if there are no expected change in inputs, wherein said process block has no output changes needed for said first number of clock cycles.

13. An apparatus comprising:
    a first circuit configured to generate (i) one or more first control signals and (ii) one or more second control signals in response to (i) an input signal and (ii) a current internal state, wherein said input signal is masked to match an entry in a memory configured to provide a next set of control signals;
    a second circuit configured to generate a third control signal and a fourth control signal in response to said one or more second control signals; and
    a third circuit configured to generate an output signal in response to (i) said one or more first control signals and (ii) said third and fourth control signals.

14. The apparatus according to claim 13, wherein said first circuit comprises a mask logic circuit.

15. The apparatus according to claim 13, wherein said second circuit comprises a CAM logic and memory circuit.

16. The apparatus according to claim 13, wherein said third circuit comprises an output logic circuit.

17. The apparatus according to claim 13, further comprising:
    an input logic circuit configured to generate said input signal; and
    a control logic circuit configured to control said CAM logic circuit.

18. The apparatus according to claim 13, wherein said apparatus is a programmable application specific integrated circuit.

19. The apparatus according to claim 13, further comprising a level 2 memory implemented as a wide dynamic random access memory (DRAM).

20. The apparatus according to claim 13, wherein said apparatus is scalable for large and small cores.

21. The apparatus according to claim 16, wherein said CAM logic implements one or more of the following (i) fast CAMS, (ii) large CAMS, (iii) more process blocks per chip I/O and (iv) faster chip I/O function.

22. The apparatus according to claim 15, wherein said CAM logic is implemented as a plurality of process blocks each configured to share entry signals for programming.

23. The apparatus according to claim 13, wherein said apparatus implements a compiler configured to (i) optimize minimization of one or more states, (ii) emulate states to minimize memory and cycles for programming.

24. The apparatus according to claim 23, wherein said compiler is configured to partition the states from simulation into process blocks.

25. The apparatus according to claim 24, wherein said compiler is configured to introduce copies of the states to multiple process blocks to consolidate other states for a process block.

26. The apparatus according to claim 25, wherein said compiler is configured to fragment process blocks into one or more pages.

27. The apparatus according to claim 26, wherein said compiler is configured to fragment the pages such that input state changes are implemented to request access one or more next page line buffers.

28. The apparatus according to claim 27, wherein said next page line buffers are configured to generate a pre-fetch launch to save time in recovering from a line-buffer miss.

29. The apparatus according to claim 13, wherein said apparatus is scalable.

30. The apparatus according to claim 13, wherein said memory comprises a random access memory or a read only memory.

31. A computer readable medium configured to store instructions to execute the following steps:
    (A) simulating one or more states;
    (B) building program information in response to said simulation;
    (C) extracting from said simulation one or more unique states having current state to next state sequences; and
    (D) fragmenting one or more process blocks to one or more pages within a compiler in response to one or more user inputs.

32. The computer readable medium according to claim 31, further configured to execute the step of:
    introducing copies of states to multiple process blocks or states, wherein said multiple states consolidate one or more other states in a process block.

33. A method for programming an application specific integrated circuit (ASIC) comprising the steps of:
    (A) simulating one or more states;
    (B) building program information in response to said simulation;
    (C) extracting from said simulation one or more unique states having current state to next state sequences;
    (D) introducing copies of states to multiple process blocks or states; and
    (E) if the process blocks or states are beyond what is available in a CAM, where there is no L2 cache, executing a line buffer miss capability routine.

* * * * *